United States Patent [19]

Nishimura

[11] Patent Number: 5,946,224

[45] Date of Patent: Aug. 31, 1999

[54] FERROELECTRIC MEMORY DEVICE, A METHOD FOR READ OUT STORED DATA AND A METHOD FOR STANDING-BY

[75] Inventor: Kiyoshi Nishimura, Kyoto, Japan

[73] Assignee: Rohm Co., Ltd., Kyoto, Japan

[21] Appl. No.: 08/996,500

[22] Filed: Dec. 23, 1997

[30] Foreign Application Priority Data

Dec. 27, 1996 [JP] Japan ..................................... 8-350037

[51] Int. Cl.$^6$ .................................................. G11C 11/22
[52] U.S. Cl. .................... 365/145; 365/185.26; 365/117; 365/121
[58] Field of Search ..................................... 365/145, 117, 365/184, 185.01, 185.26, 121, 182, 180

[56] References Cited

U.S. PATENT DOCUMENTS

| | | | |
|---|---|---|---|
| 5,515,311 | 5/1996 | Mihara ..................................... | 365/145 |
| 5,633,821 | 5/1997 | Nishimura et al. ..................... | 365/145 |

*Primary Examiner*—David Nelms
*Assistant Examiner*—Thong Le
*Attorney, Agent, or Firm*—Merchant, Gould, Smith, Edell, Welter & Schmidt

[57] ABSTRACT

It is an object of the present invention to provide a ferroelectric memory device having a high integration and capable of maintaining nonvolatility. A threshold voltage $V_{th}$ of a ferroelectric memory element is set at value slightly higher than a voltage $-V_1$. A voltage 0V is applied as a gate voltage $V_G$ when the stored data is read out. A voltage $V_1$ is generated at a MOS capacitor $C_{MOS}$ if the data "High" is stored and the voltage $-V_1$ is generated at the MOS capacitor $C_{MOS}$ if the data "Low" is stored. The stored data is read out by detecting a drain current during generation of the voltages. Also, a voltage 0V is applied as the gate voltage $V_G$ when stand-by operation is carried out. In this way, variation of the gate voltage $V_G$ caused by switching ON and OFF of a power source can be prevented. So that, nonvolatility of the ferroelectric memory device can be maintained as a result of preventing spontaneous polarization of a ferroelectric capacitor $C_{ferro}$. Further, it is not necessary to provide a circuit for generating a voltage for using read out the data to the ferroelectric memory device. So that, integration of the ferroelectric memory device can be increased.

12 Claims, 9 Drawing Sheets

Fig.8

| | SL1 | SL2 | SL3 | DL1 (Q01) | DL2 (Q02) | DL3 (Q03) | CGL1 | CGL2 | CGL3 |
|---|---|---|---|---|---|---|---|---|---|
| WRITE (M22) | — | GND | — | — | — | — | GND | +V$_{DD}$ or −V$_{DD}$ | GND |
| READ OUT (M22) | — | GND | — | — | Vdr (Q02:ON) | — | GND | GND | GND |
| STAND BY | GND | GND | GND | — | — | — | GND | GND | GND |

FERROELECTRIC MEMORY DEVICE, A METHOD FOR READ OUT STORED DATA AND A METHOD FOR STANDING-BY

Cross-Reference to Related Application

The entire disclosure of Japanese Patent Application No. Hei 8-350037 filed on Dec. 27, 1996 including specification, claims, drawings and summary are incorporated herein by reference in its entirety.

BACKGROUND OF INVENTION

1. Field of the Invention

This invention relates to a ferroelectric memory device, more specifically a memory device using a metal-ferroelectric-metal-isolator-silicon-field effect transistor (hereinafter referred to as MFMIS-FET) as a ferroelectric memory element.

2. Description of the Related Art

A ferroelectric memory device using the MFMIS-FET is known to the public. Japanese laid-open publications No. Hei 8-36891, Hei 7-249288 and Hei 8-8408 and other publications disclose such ferroelectric memory device. FIG. 9A shows a schematic symbol of the ferroelectric memory element used for the ferroelectric memory device.

A voltage is applied between a control gate electrode CG and a memory gate electrode MG in order to store data in the ferroelectric memory element. By applying the voltage, a ferroelectrics FE is tuned into a polarization state in accordance with the applied voltage. The polarization state at the ferroelectrics FE is maintained even when a power source is turned off. Two different polarization states such as positive polarization state or negative polarization state can be obtained by switching polarity of the voltage. For instance, the ferroelectrics FE is polarized so as to make a region confronted with the control gate electrode CG in the negative polarization state when a voltage lower than a voltage applied to the control gate electrode CG is applied to the memory gate electrode MG (this condition is hereinafter referred to as a first storing condition). On the contrary, the ferroelectrics FE is polarized so as to make the region confronted with the control gate electrode CG in the positive polarization state when a voltage higher than a voltage applied to the control gate electrode CG is applied to the memory gate electrode MG (this condition is hereinafter referred to as second storing condition). Thus, two different polarization states (data) can be stored a under nonvolatile condition by the ferroelectric memory element.

Read-out of the data thus stored is carried out by detecting a drain current $I_D$ when a reference voltage $V_{ref}$ (a threshold voltage of the ferroelectric memory element when the ferroelectrics FE does not cause spontaneous polarization) is applied to the control gate electrode CG with opening the memory gate electrode MG as well as grounding a source electrode S. FIG. 9B shows a relationship between a voltage $V_{CG}$ applied to the control gate electrode CG and the drain current $I_D$. In FIG. 9B, the relationship between the voltage $V_{CG}$ and the drain current $I_D$ at the first storing condition is illustrated as a curve "(a)". Also, another relationship between the voltage $V_{CG}$ and the drain current $I_D$ is shown as a curve "b" when no polarization is observed at the ferroelectrics FE, and the relationship between the voltage $V_{CG}$ and the drain current $I_D$ at the second storing condition is illustrated as a curve "C" respectively.

The drain current $I_D$ is equivalent to a current $I_S$ when no polarization is observed at the ferroelectrics FE in case of applying the reference voltage $V_{ref}$ to the control gate electrode CG. The drain current $I_D$ is equivalent to a current $I_1$ when the ferroelectrics FE is in the first storing condition. Further, the drain current $I_D$ is equivalent to a current $I_2$ when the ferroelectrics FE is in the second storing condition. In this way, judgement of the stored data can be carried out by judging whether or not the drain current $I_D$ has a larger value than that of the current $I_S$ when the reference voltage $V_{ref}$ is applied to the control gate electrode CG.

Thus, an nonvolatile memory element can be made by using just one transistor when using the MFMIS-FET as the ferroelectric memory element. Further, it is not necessary for the ferroelectric memory device to carry out rewrite operation because the stored data is unchanged during read out operation (no turn-over of polarization is done). So that, a circuit for carrying out rewrite operation is not needed, and the number of the read-out operations is unlimited because the ferroelectrics FE does not reach its limit of endurance. In other words, it is possible to make an nonvolatile memory device which has a high integration and capable of carrying out the read-out operation unlimitedly.

However, the conventional ferroelectric memory device described in above has the following problems to be resolved. The conventional ferroelectric memory device is made so as to apply the reference voltage $V_{ref}$ to the control gate electrode CG during the read-out operation as shown in FIG. 9B. So that, it is necessary to provide a circuit for supplying the reference voltage $V_{ref}$ accurately to the ferroelectric memory device in order to maintain the voltage applied to the ferroelectrics FE under a settled value. Therefore, integration of the nonvolatile memory device is decreased because structure of the circuit for supplying the reference voltage $V_{ref}$ is complex.

In addition, the voltages applied to the control gate electrode CG become unstable conditions when the power source is switched to ON and OFF even when the circuit for supplying the reference voltage $V_{ref}$ is provided. So that, polarization state of the ferroelectrics FE is changed unexpectedly. In other words, the stored data in the ferroelectrics FE can possibly be erased by repeated switching of the power source.

SUMMARY OF THE INVENTION

It is an object of the present invention to provide a ferroelectric memory device having a high integration and capable of maintaining nonvolatility.

In accordance with characteristics of the present invention, a ferroelectric memory device including a ferroelectric memory element, the ferroelectric memory element comprises:

a source region and a drain region both of which are made of a first conductive type material, a channel region being made of a second conductive type material located between the source region and the drain region, a lower conductive layer being formed on the channel region as a conductive layer electrically insulated therefrom, a ferroelectric layer being formed on the lower conductive layer capable of storing either of a first polarization state corresponding to a first storing condition or a second polarization state corresponding to a second storing condition respectively, and an upper conductive layer being formed on the ferroelectric layer as a conductive layer, the ferroelectric memory device is characterized in that, a predetermined channel is formed in the channel region when a voltage detected at the lower conductive layer is equivalent to a first lower conductive layer voltage and the predetermined channel is not formed in the channel region when the voltage detected at the lower conductive layer is equivalent to a second lower conductive layer voltage by setting a critical voltage of the lower conductive layer capable of forming the predetermined channel in the channel region, the critical voltage of the lower conductive layer is set within a range between the first lower conductive layer voltage and the second lower conductive layer voltage in case of defining the voltage detected at the lower conductive layer under the first polarization state as the first lower conductive layer voltage when a voltage applied to the upper conductive layer relative to the source region is substantially 0V and defining the voltage detected at the lower conductive layer under the second polarization state as the second lower conductive layer voltage when the voltage applied to the upper conductive layer relative to the source region is substantially 0V.

While the novel features of the invention are set forth in a general fashion, both as to organization and content, it will be better understood and appreciated, along with other objects and features thereof from the following detailed description taken in conjunction with the drawings.

BRIEF DESCRIPTION OF THE DRAWINGS

FIG. 8 is a table showing voltages applied to each of the lines during write operation, read-out operation and stand-by operation when a memory element $M_{22}$ is appointed as the ferroelectric memory element being stored or read out the data.

DETAILED DESCRIPTION OF THE PREFERRED EMBODIMENT

Figure 1A:
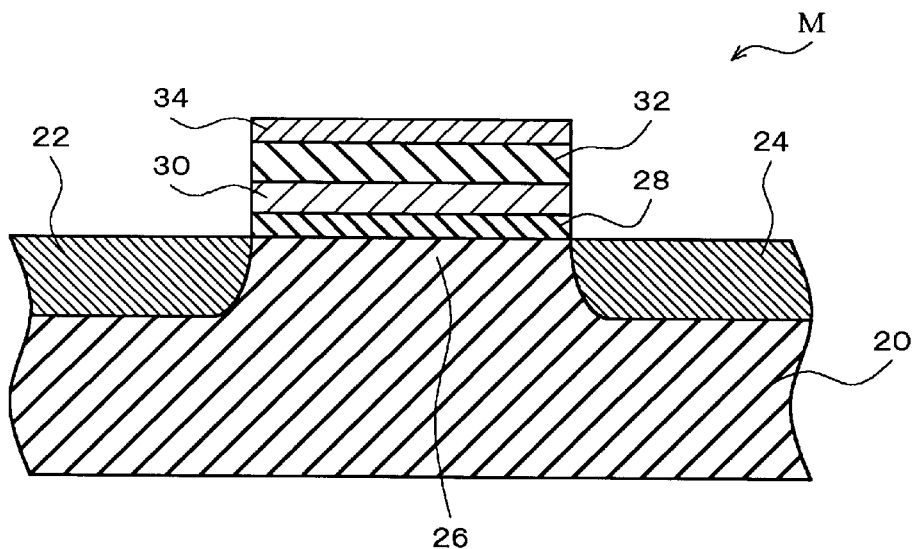
FIG. 1A is a cross sectional view illustrating structure of a ferroelectric memory element M used for a ferroelectric memory as a ferroelectric memory device of an embodiment of the present invention.

FIG. 1A is a cross sectional view illustrating the structure of a ferroelectric memory element (ferroelectric storing element) M used for a ferroelectric memory as a ferroelectric memory device of an embodiment of the present invention. Both a source region 22 made of an n-type semiconductor and a drain region 24 composed of an n-type semiconductor are formed in a silicon substrate 20. An insulation layer 28 made of a silicon oxide ($SiO_2$) is formed on a channel region 26 composed of the p-type semiconductor. A lower conductive layer 30 is formed by depositing polysilicon (Poly-Si), iridium oxide ($IrO_2$) and iridium (Ir) in that order on the insulation layer 28.

A ferroelectric layer 32 made of PZT or being made with other ferroelectric materials is located on the lower conductive layer 30. The ferroelectric layer 32 is able to store either the first polarization state or the second polarization state in correspondence to the first storing condition and the second storing condition respectively.

Further, an upper conductive layer 34 is formed by depositing both of iridium oxide ($IrO_2$) and iridium (Ir) in that order on the ferroelectric layer 32.

Other materials such as silicon nitride (SiN) or the like can be used for forming the insulation layer 28 beside the materials being introduced above. In addition, oxide conductive materials such as ruthenium oxide (RuOx), Indium tin oxide (ITO) or the like, or metals such as platinum (Pt), lead (Pb), gold (Au), silver (Ag), aluminum (Al), nickel (Ni) or the like can also be used for forming the lower conductive layer 30 and/or the upper conductive layer 34 instead of the materials being described above.

Figure 1B:
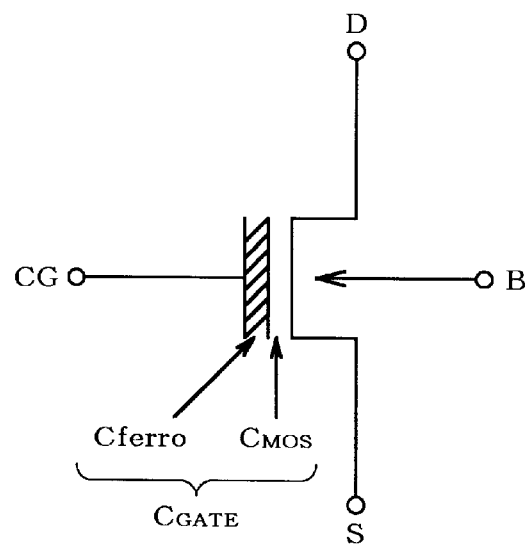
FIG. 1B is a view showing schematic symbol of the ferroelectric memory element M.

FIG. 1B is a view showing schematic symbol of the ferroelectric memory element M shown in FIG. 1A. A control gate electrode CG is connected to the upper conductive layer 34. The lower conductive layer 30 is made under the floating state because no electrodes are connected thereto. A source electrode S and a drain electrode D are connected to the source region 22 and the drain region 24 respectively.

As shown in FIG. 1A and FIG. 1B, the ferroelectric memory element M may be assumed as two capacitors such as a ferroelectric capacitor $C_{ferro}$ formed between the upper conductive layer 34 and the lower conductive layer 30 and a MOS capacitor$_{MOS}$ formed between the lower conductive layer 30 and the channel region 26 both of which are connected to each other in series. The capacitor incorporating both the ferroelectric capacitor $C_{ferro}$ and the MOS capacitor$_{MOS}$ is referred to as a capacitor $C_{GATE}$. Voltage/ charge characteristics of the ferroelectric capacitor $C_{ferro}$ and the capacitance of the MOS capacitor$_{MOS}$ is set as described hereunder.

As described later, existence of electric charge $Q_{MOS}$ and generation of a divided voltage $V_{MOS}$ in the MOS capacitor$_{MOS}$ are observed in accordance with a polarization state when a gate voltage V$_G$ is applied to the control gate CG after grounding the channel region 26 of the ferroelectric memory element M. As a result, the stored data can be read out by detecting the value of the divided voltage V$_{MOS}$ in some way.

Figure 2:
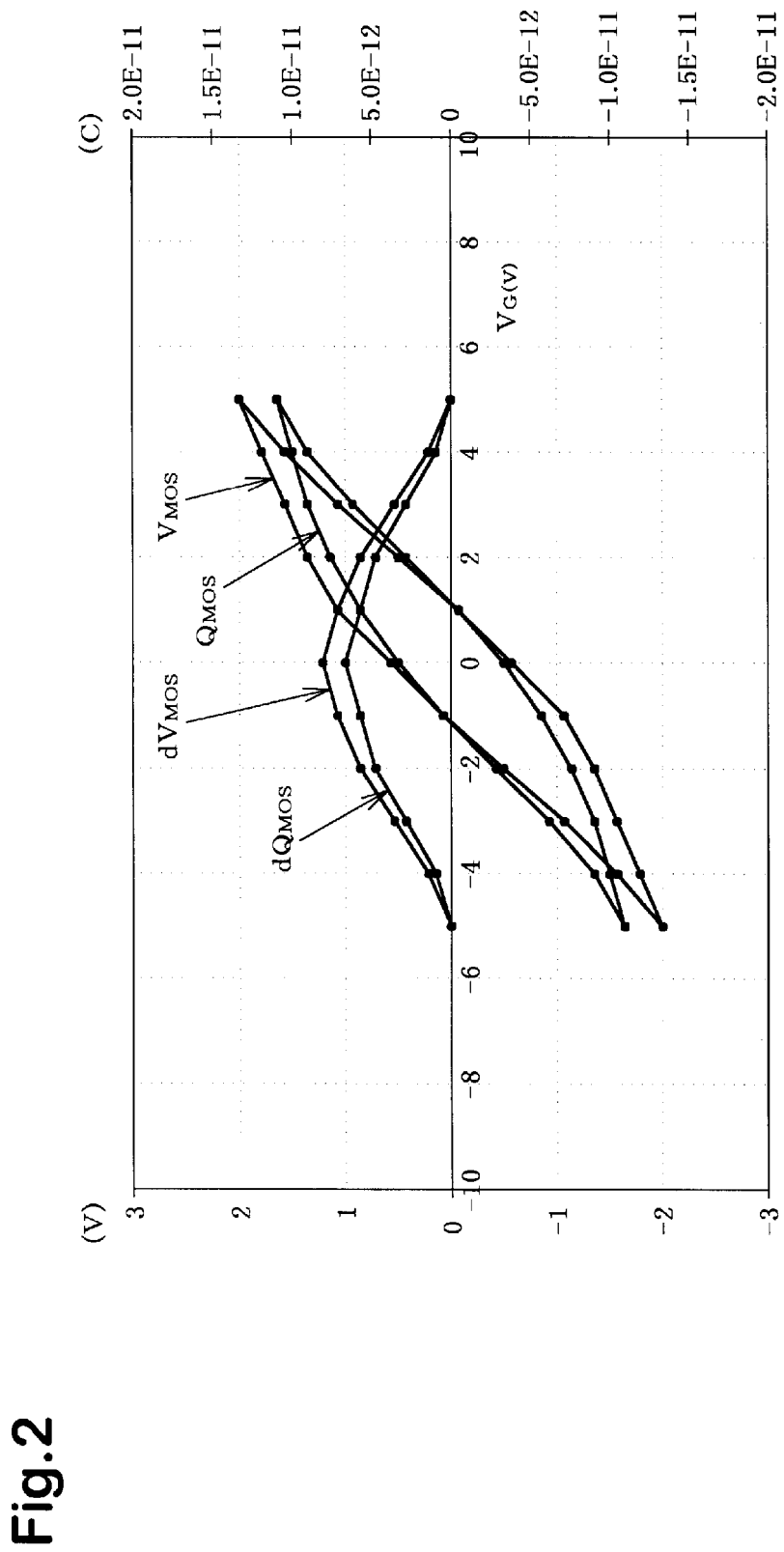
FIG. 2 is a graph showing a relationship among gate voltages $V_G$, divided voltages $V_{MOS}$ and electric charges $Q_{MOS}$.

FIG. 2 is a graph showing a relationship among the gate voltages V$_G$, the divided voltages V$_{MOS}$ and the electric charges Q$_{MOS}$. Detected values of these are shown in hysteresis loops. In FIG. 2, a curve dV$_{MOS}$ shows voltage differences of the divided voltages V$_{MOS}$ detected in the MOS capacitor$_{MOS}$ during the polarization states when the gate voltage V$_G$ having the same value is applied. And another curve dQ$_{MOS}$ shows charge differences of the electric charge Q$_{MOS}$ detected in the MOS capacitor$_{MOS}$ when the gate voltage V$_G$ having the same value is applied.

As shown in FIG. 2, the maximum value of the voltage difference dV$_{MOS}$ is observed when 0V is applied as the gate voltage V$_G$. So that, the ferroelectric memory element M in this embodiment is designed so as to satisfy an equation of V$_G$=0V when a read-out operation is carried out. In this way, enough tolerance for detecting the divided voltages V$_{MOS}$ can be secured during the read-out operation.

Both the voltage differences dV$_{MOS}$ and the charge differences dQ$_{MOS}$ shown in FIG. 2 are determined by a relationship between the voltage/charge characteristics (which shows hysteresis) of the ferroelectric capacitor C$_{ferro}$ and the voltage/charge characteristics (capacitance) of the MOS capacitance C$_{MOS}$ beside the value of the gate voltage V$_G$.

Figure 3:
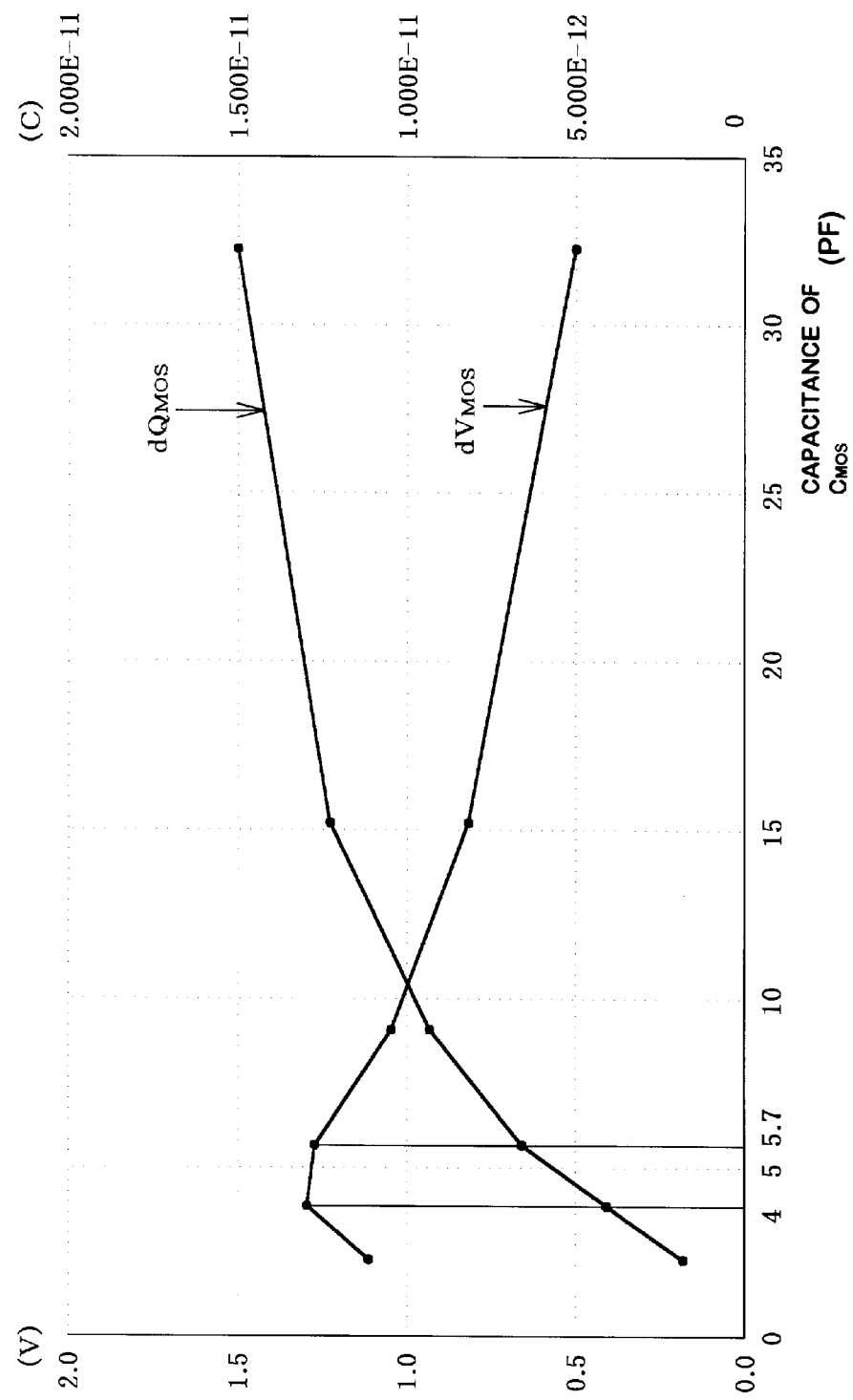
FIG. 3 is a graph showing a relationship among capacitances of a MOS capacitor $C_{MOS}$, voltage differences $dV_{MOS}$ and electric charge differences $dQ_{MOS}$ in case of a gate voltage $V_G$ is equal to 0V when voltage/charge characteristics of a ferroelectric capacitor $C_{ferro}$ is fixed to a certain value.

FIG. 3 is a graph showing a relationship among a capacitance of the MOS capacitor C$_{MOS}$, the voltage differences dV$_{MOS}$ and the electric charge differences dQ$_{MOS}$ in case of the gate voltage V$_G$ being set at 0V when the voltage/charge characteristics of the ferroelectric capacitor C$_{ferro}$ is fixed to a certain value. In an example shown in FIG. 3, the voltage differences dV$_{MOS}$ is maximized when the capacitance of the MOS capacitor C$_{MOS}$ is approximately 4 pF.

So that, it is logical to make the capacitance of the MOS capacitor C$_{MOS}$ to 4 pF in order to secure enough tolerance for detecting of the divided voltages V$_{MOS}$. However, the capacitance of the MOS capacitor C$_{MOS}$ is made a slightly higher value than 4 pF (5.7 pF in this embodiment) in this embodiment. This is because a slope of a curve which shows the voltage differences dV$_{MOS}$ becomes relatively steep when the capacitance of the MOS capacitor C$_{MOS}$ is less than 4 pF. Consequently, there is a probability to vary the voltage differences dV$_{MOS}$ within an unexpected range when the capacitance of the MOS capacitor C$_{MOS}$ is designed at 4 pF because variation of the capacitance is caused during the manufacturing processes. Also, too much influence caused by noise possibly generated when the capacitance of the MOS capacitor C$_{MOS}$ is designed to a low value because value of the electric charge differences dQ$_{MOS}$ becomes very low as shown in FIG. 3.

Figure 4:
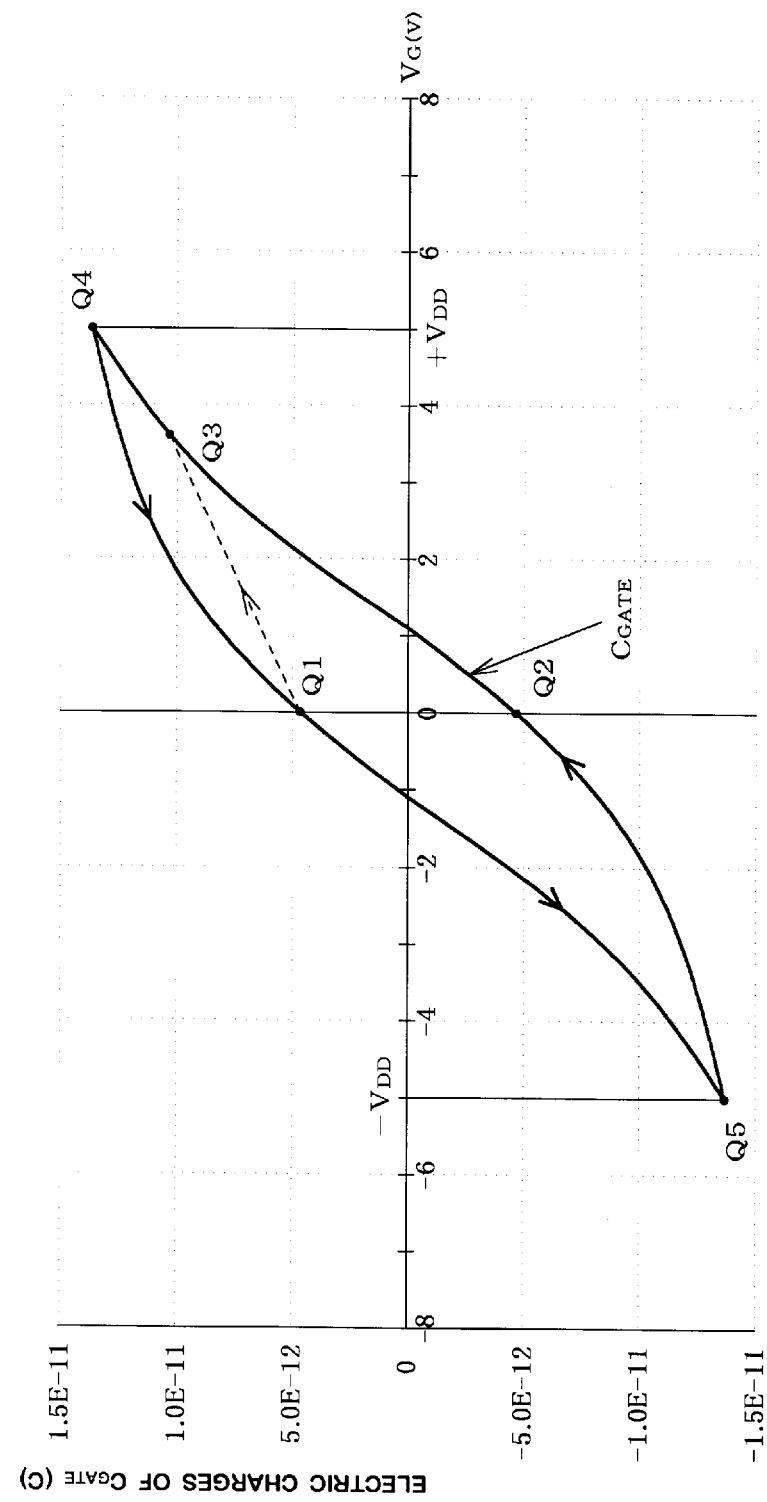
FIG. 4 is a graph showing an example of voltage/charge characteristics of a GATE capacitor $C_{GATE}$.

The voltage/charge characteristics of the ferroelectric capacitor C$_{ferro}$ and the capacitance of the MOS capacitor$_{MOS}$ is set as described above. An example of voltage/charge characteristics of the GATE capacitor C$_{GATE}$ thus set is shown in FIG. 4. The voltage/charge characteristics of the ferroelectric capacitor C$_{ferro}$ and the capacitance of the MOS capacitoros$_{MOS}$ in the case of using FIG. 4 is shown in FIG. 5.

Next, a threshold voltage V$_{th}$ of the ferroelectric memory element M is set. Existence of electric charge Q$_{MOS}$ and generation of the divided voltage V$_{MOS}$ in the MOS capacitor$_{MOS}$ are observed in accordance with the polarization state when the gate voltage V$_G$ is applied to the control gate CG after grounding the channel region 26 of the ferroelectric memory element M having the characteristics shown in FIG. 4 and FIG. 5 as described above (see FIG. 2).

Figure 5:
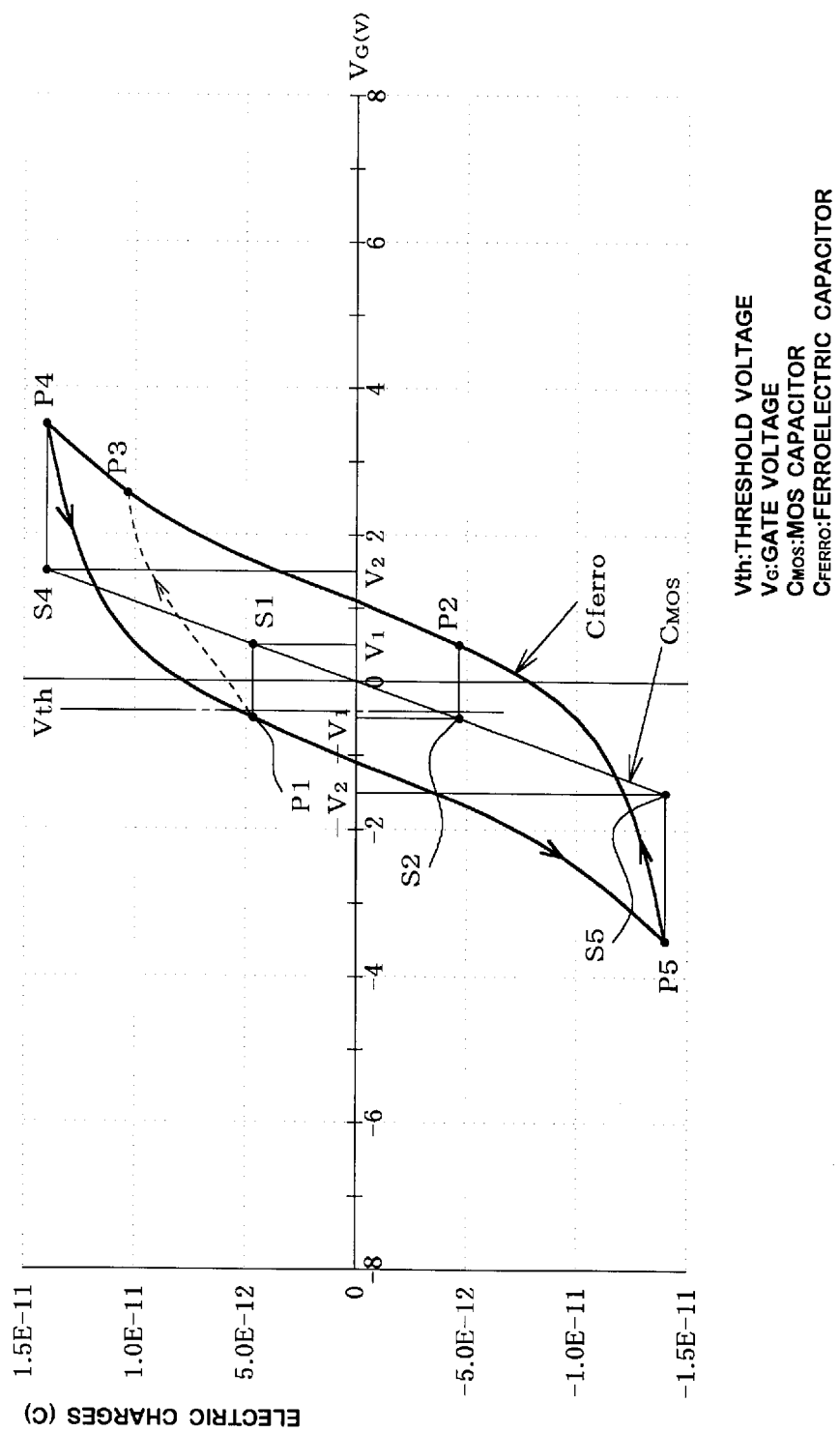
FIG. 5 is a graph showing voltage/charge characteristics of the GATE capacitor $C_{GATE}$ and the MOS capacitor $C_{MOS}$ in the case shown in FIG. 4.

According to a pictorial solution method shown in FIG. 5, either a voltage V$_1$ (a divided voltage V$_{MOS}$ generated when the ferroelectric layer 32 is in the first polarization state) or a voltage −V$_1$ (another divided voltage V$_{MOS}$ generated when the ferroelectric layer 32 is in the second polarization state) is generated at the lower conductive layer 30 when the gate voltage V$_G$ equal to 0V is applied.

So that, the threshold voltage V$_{th}$ is set to a value slightly higher than that of the voltage −V$_1$. For instance, it is preferable to set the threshold voltage V$_{th}$ to approximately −0.4V when the voltage −V$_1$ is −0.5V.

By setting the threshold voltage V$_{th}$ in that way, no drain current is observed when the voltage −V$_1$ is detected at the lower conductive layer 30, and value of the drain current is increased when the voltage V$_1$ is detected at the lower conductive layer 30. In this way, a large amount of the drain current can be flown when the data stored in the ferroelectric memory element M is in the first storing condition, and just a small amount of the drain current is flown when the data stored in the ferroelectric memory element M is in the second storing condition. As a consequence, the read-out operation can be carried out at a high speed.

The threshold voltage V$_{th}$ is adjusted by varying the density of impurities in the channel region 26 during the ion implantation or similar methods. Adjustment of the threshold voltage V$_{th}$ can be done by other methods. For instance, the threshold voltage V$_{th}$ can be adjusted by varying the work function difference between the upper conductive layer 34 and the lower conductive layer 30, and by varying electric charges being held in the insulation layer 28.

The threshold voltage V$_{th}$ corresponds to the critical voltage of the lower conductive layer. Also, the voltage V$_1$ is equivalent to a first lower conductive layer voltage. And the voltage −V$_1$ corresponds to a second lower conductive layer voltage.

Figure 6A:
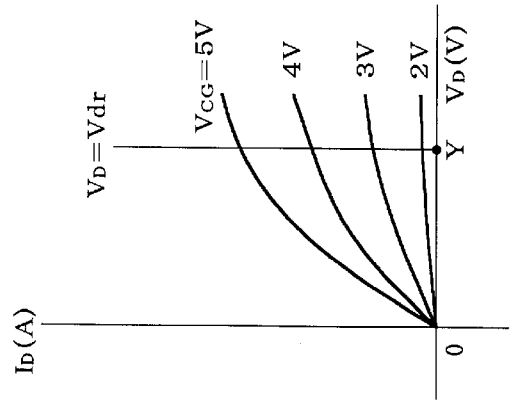
FIG. 6A is a graph showing a relationship between a drain voltage $V_D$ and a drain current $I_D$ in the case of using a voltage $V_{CG}$ of a control gate electrode CG as a parameter when data stored in the ferroelectric memory element M is in "High" state (the first storing condition).
Figure 6B:
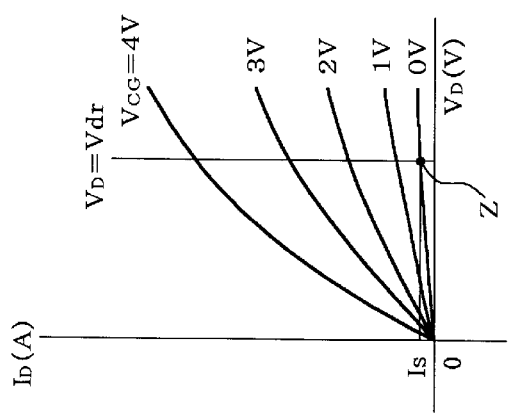
FIG. 6B is a graph showing a relationship between the drain voltage $V_D$ and the drain current $I_D$ in the case of using the voltage $V_{CG}$ of the control gate electrode CG as a parameter when the ferroelectrics FE does not cause spontaneous polarization.
Figure 6C:
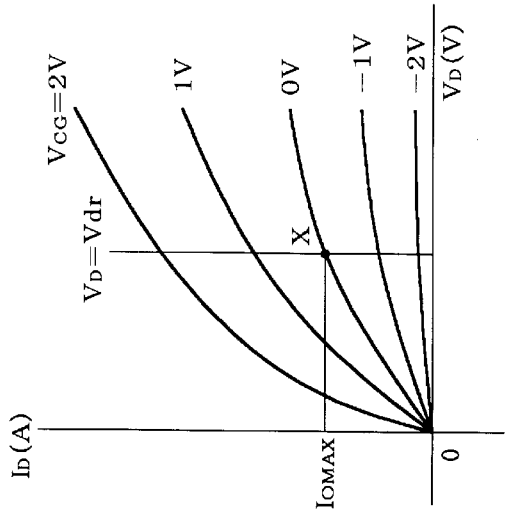
FIG. 6C is a graph showing a relationship between a drain voltage $V_D$ and a drain current $I_D$ in the case of using a voltage $V_{CG}$ of a control gate electrode CG as a parameter when the data stored in the ferroelectric memory element M is in "Low" state (the second storing condition).

FIG. 6A, FIG. 6B and FIG. 6C are graphs showing relationships between the drain voltage V$_D$ and the drain current I$_D$ of the ferroelectric memory element M which set the threshold voltage V$_{th}$ as described above in the case of using the voltage V$_{CG}$ of the control gate electrode CG as a parameter. FIG. 6A is a graph showing the relationship when the data stored in the ferroelectric memory element M is in "High" state (the first storing condition). Also, FIG. 6B is a graph showing the relationship when the ferroelectric layer 32 does not cause spontaneous polarization. Further, FIG. 6C is a graph showing the relationship when the data stored in the ferroelectric memory element M is in "Low" state (the second storing condition).

Figure 7:
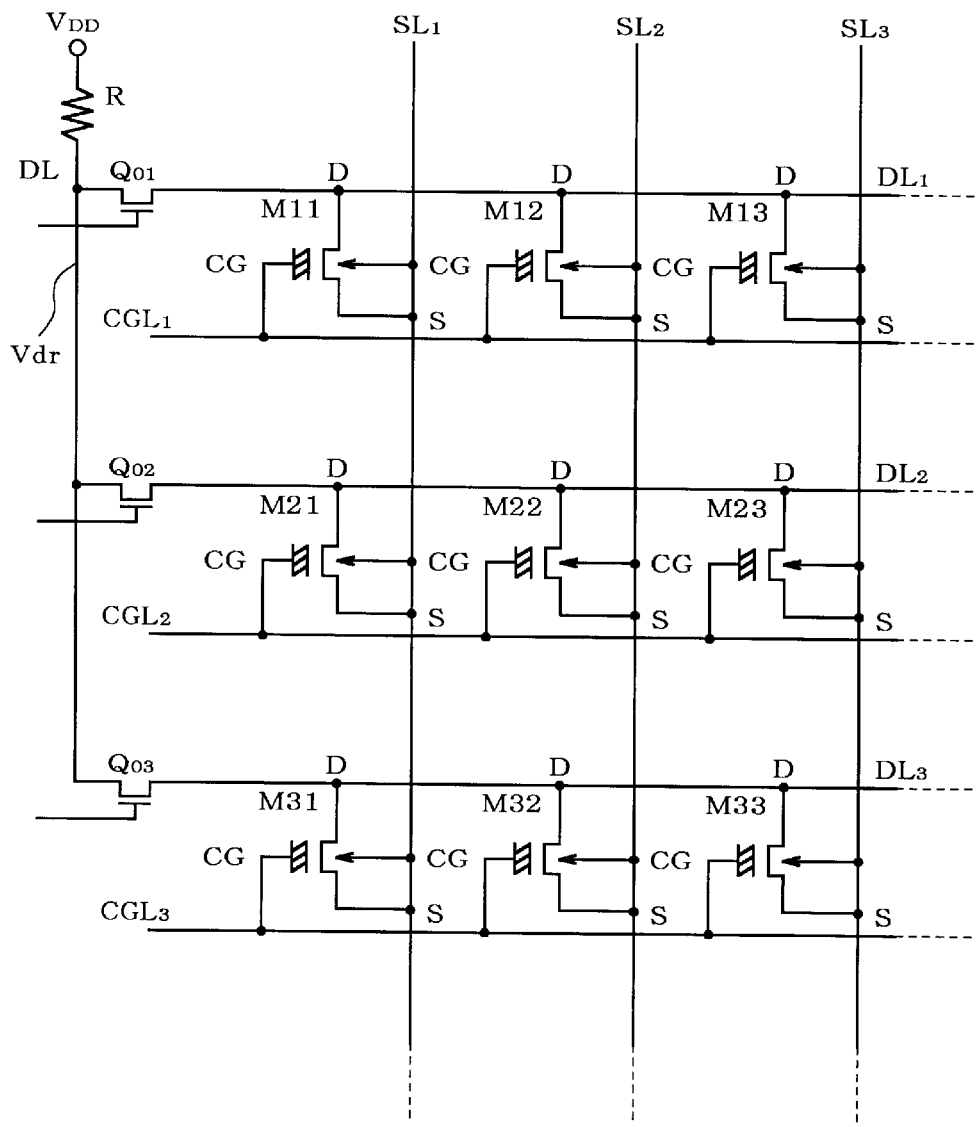
FIG. 7 is a circuit diagram of the ferroelectric memory composed of a plurality of the ferroelectric memory elements M connected in a matrix structure.
Figure 9A:
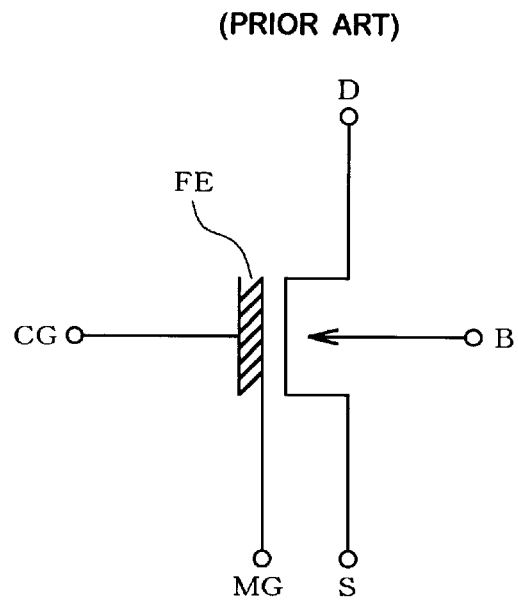
FIG. 9A is a view showing schematic symbol of a ferroelectric memory element used for a conventional ferroelectric memory.
Figure 9B:
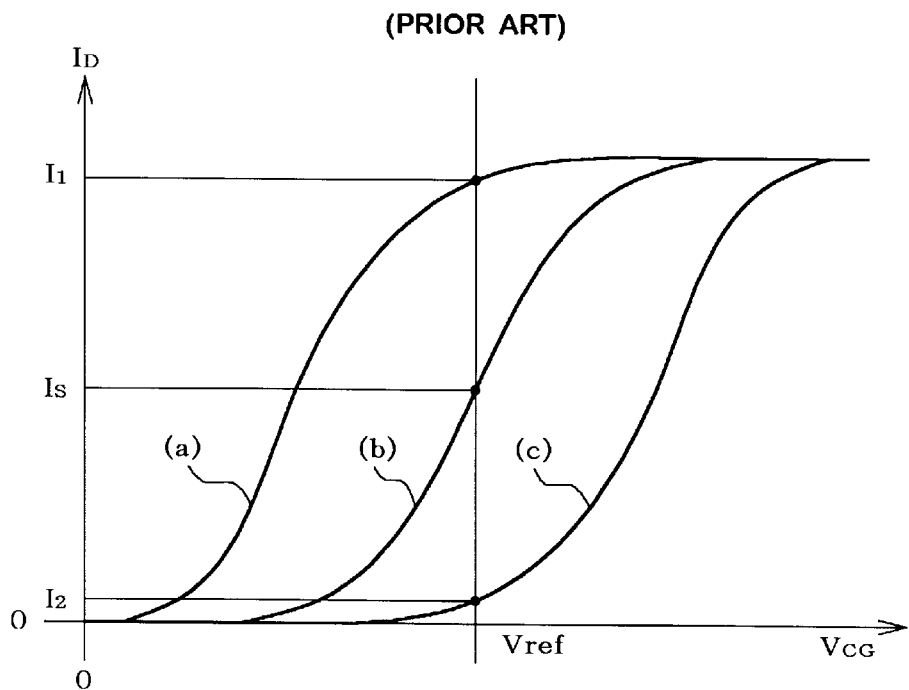
FIG. 9B is a graph showing a relationship between the voltage $V_{CG}$ applied to the control gate electrode CG of the ferroelectric memory element and the drain current $I_D$ shown in FIG. 9A.

Next, FIG. 7 shows a ferroelectric memory composed of a plurality of the ferroelectric memory elements M shown in FIG. 1 connected in a matrix structure. All the drain electrodes D of the ferroelectric memory elements M located on a certain row are connected to a certain drain line (for instance, all the drain electrodes D of the ferroelectric memory elements M$_{11}$, M$_{12}$, M$_{13}$ . . . are connected to a drain line DL$_1$). Each of the drain lines DL$_1$, DL$_2$, DL$_3$ . . . is connected to a united drain line DL through transistors Q$_{01}$, Q$_{02}$, Q$_{03}$ . . . A power source voltage V$_{DD}$ is applied to the united drain line DL through a resistance R.

In this embodiment, voltage of the united drain line DL is set so as the voltage becomes approximately 0.1V by adjusting resistivity of the resistance R. The voltage thus set is similar to the minimum voltage capable of judging the stored data by evaluating the drain current during the read-out operation described later. By setting the voltage in that way, variation of electric potentials at the center of the channel region 26 can be decreased during the read-out operation. As a result, erroneous data writing to the ferroelectric layer 32 can be prevented during the read-out operation.

The control gate electrodes CG located on a certain row of the ferroelectric memory elements are connected to a certain control gate line (for instance, all the control gate electrodes CG of the ferroelectric memory elements $M_{11}$, $M_{12}$, $M_{13}$ ... are connected to a control gate $CGL_1$).

Further, both the source electrodes S and substrates (channel) B located on a certain column are connected to a certain source line (for instance, all the source electrodes and the substrates of the ferroelectric memory elements $M_{12}$, $M_{22}$, $M_{32}$ ... are connected to a source line $SL_2$). The lower conductive layers 30 for each of the ferroelectric memory elements are made under the floating state because none of the lines are connected thereto.

FIG. 8 is a table showing voltages applied to each of the lines during the write operation, the read-out operation and stand-by operation when the memory element $M_{22}$ is appointed as the ferroelectric memory element being stored with the data or being read out of the data.

The source lines $SL_1$, $SL_3$ ... are made under the floating state except for the source line $SL_2$ being applied the ground voltage during the write operation. Further, either of the power source voltages ($+V_{DD}$ (5V) or $-V_{DD}$ (-5V)) both of which represent the data being stored is applied only to the control gate line $CGL_2$, and the ground voltage is applied to other control gate lines $CGL_1$, $CGL_3$ ... . Further, the transistors $Q_{01}$, $Q_{02}$, $Q_{03}$ ... connected to the drain lines $DL_1$, $DL_2$, $DL_3$ ... are under the off state.

The polarization state at each of the ferroelectric memory elements $M_{11}$, $M_{21}$, $M_{31}$ ... $M_{13}$, $M_{23}$, $M_{33}$ ... being connected to the source line $SL_1$ and $SL_2$ both of which are under the floating state, is unchanged regardless of applying a voltage to the control gate electrode CG or not because a voltage detected at the ferroelectric layers 32 of the ferroelectric memory elements is stable. As a result, the writing operation does not exert any influence on these ferroelectric memory elements.

There is a slight probability of changing the polarization state of the ferroelectric layers 32 of the ferroelectric memory elements $M_{12}$, $M_{22}$, $M_{32}$ ... connected to the source line $SL_2$ in accordance with the voltage applied to the control gate electrode CG because the source line $SL_2$ is grounded. However, the polarization state of the ferroelectric layers 32 of the ferroelectric memory elements $M_{12}$ and $M_{32}$ is unchanged because the voltage detected at the ferroelectric layers 32 of these ferroelectric memory elements is stable since the ground voltage is applied to the control gate electrodes CG of the ferroelectric memory elements $M_{12}$ and $M_{32}$. On the contrary, either of the power source voltages $+V_{DD}$ or $-V_{DD}$ is applied to the control gate electrode CG of the ferroelectric memory elements $M_{22}$. As a result, the polarization state of the ferroelectric layer 32 of the ferroelectric memory $M_{22}$ is changed because the voltage detected at the ferroelectric layer 32 is varied in accordance with the voltage applied to the control gate electrode CG.

The procedure of varying polarization state of the ferroelectric layer 32 of the ferroelectric memory $M_{22}$ is described hereunder with reference to FIG. 4 and FIG. 5. A point Q1 shown in FIG. 4 shows voltages and electric charges existing in the capacitor $C_{GATE}$ incorporating both the ferroelectric capacitor $C_{ferro}$ and the MOS capacitor$_{MOS}$ when the ferroelectric memory $M_{22}$ is in stand-by state (0V is applied to the control gate electrode CG as the gate voltage $V_G$, as described later) in the case of turning the ferroelectric layer 32 in the first polarization state. At that time, the voltages and the electric charges existing in both the ferroelectric capacitor $C_{ferro}$ and the MOS capacitor$_{MOS}$ are illustrated by a point P1 and a point S1 shown in FIG. 5 respectively.

The value of the electric charges shown in both the point P1 and the point S1 is equivalent to that of the electric charges illustrated by the point Q1 shown in FIG. 4 because both the ferroelectric capacitor $C_{ferro}$ and the MOS capacitor$_{MOS}$ are connected in series. The sum of the voltages at the point P1 and the point S1 is equivalent to the gate voltage $V_G$ (0V) applied at the stand-by state. So that, the voltage $-V_1$ at the point P1 has the same absolute value and opposite polarity to the voltage $V_1$ at the point $S_1$ as shown in FIG. 5.

The point P1 shown in FIG. 5 corresponds to the first polarization state of the ferroelectric layer 32 (equivalent to the stored data "High"). The write operation which does not accompany with polarization turn-over of the ferroelectric layer 32 (so called "same state writing"), in other words the write operation by carrying out data "High" again is described herein.

The condition of the voltage and the electric charges existing in the capacitor $C_{GATE}$ is moved to a point Q4 from the point Q1 through a point Q3 as shown in FIG. 4 when the power source voltage $+V_{DD}$ is applied to the control gate electrode CG as a gate voltage $V_G$ for writing data "High". At that time, the condition of the voltage and the electric charges existing in the ferroelectric capacitor $C_{ferro}$ is changed to a point P4 from the point P1 through a point P4 as shown in FIG. 5. Similarly, the condition of the voltage and the electric charges existing in the MOS capacitor$_{MOS}$ is changed to a point S4 from the point S1. In other words, a voltage generated at the MOS capacitor$_{MOS}$ is varied to a voltage $V_2$ from the voltage $V_1$.

Here, the condition of the voltage and the electric charges existing in the capacitor $C_{GATE}$ is returned to the point Q1 from the point Q4 as shown in FIG. 4 when the ferroelectric memory $M_{22}$ is turned to the stand-by state (0V is applied to the control gate electrode CG as the gate voltage $V_G$). At that time, the condition of the voltage and the electric charges existing in the ferroelectric capacitor $C_{ferro}$ is returned to the point P1 from the point P4 as shown in FIG. 5. Similarly, the condition of the voltage and the electric charges existing in the MOS capacitor$_{MOS}$ is returned to the point S1 from the point S4. In other words, the voltage generated at the MOS capacitor$_{MOS}$ comes back to the earliest voltage $V_1$. The voltage $V_1$ is a voltage of the lower conductive layer 30 during the write operation of the data "High".

Next, the write operation accompanied with polarization turn-over of the ferroelectric layer 32 (so called "opposite state writing") from the condition shown in the point P1 (corresponding to the stored data "High") of FIG. 5, in other words the write operation by carrying out data "Low" is described herein.

The condition of the voltage and the electric charges existing in the capacitor $C_{GATE}$ is moved to a point Q5 from the point Q1 as shown in FIG. 4 when the power source voltage $-V_{DD}$ is applied to the control gate electrode CG as a gate voltage $V_G$ for writing data "Low". At that time, the condition of the voltage and the electric charges existing in the ferroelectric capacitor $C_{ferro}$ is changed to a point P5 from the point P1 as shown in FIG. 5. Similarly, the condition of the voltage and the electric charges existing in the MOS capacitor$_{MOS}$ is changed to the point S5 from the point S1. In other words, a voltage generated at the MOS capacitor$_{MOS}$ is varied to a voltage $-V_2$ from the voltage $V_1$.

Here, the condition of the voltage and the electric charges existing in the capacitor $C_{GATE}$ comes to the point Q2 from the point Q5 as shown in FIG. 4 when the ferroelectric memory $M_{22}$ is turned to the stand-by state (0V is applied to the control gate electrode CG as the gate voltage $V_G$). At that time, condition of the voltage and the electric charges existing in the ferroelectric capacitor $C_{ferro}$ comes to the point P2 from the point P5 as shown in FIG. 5. Similarly, the condition of the voltage and the electric charges existing in the MOS capacitor$_{MOS}$ comes to the point S2 from the point S5. In other words, the voltage generated at the MOS capacitor$_{MOS}$ becomes to the voltage $-V_1$. The voltage $-V_1$ is a voltage of the lower conductive layer 30 during the write operation of the data "Low". Also, the point P5 shown in FIG. 5 is equivalent to the second polarization state of the ferroelectric layer 32 (corresponding to the data "Low").

In this way, the ferroelectric layer 32 of the ferroelectric memory elements $M_{22}$ is polarized by applying the voltages depending on the data to be stored. In other words, the ferroelectric layer 32 of the ferroelectric memory elements $M_{22}$ is polarized to either the first polarization state or the second polarization state in accordance with the voltages depending on the data to be stored.

The source lines $SL_1$, $SL_3$ . . . are made under the floating state except for the source line $SL_2$ being applied the ground voltage during the read-out operation. Also, the ground voltage is applied to all the control gate lines $CGL_1$, $CGL_2$, $CGL_3$ . . . Further, only the transistor $Q_{02}$ of the drain line $DL_2$ connecting the ferroelectric memory elements $M_{22}$ being read out of the data is turned on. And the drain line $DL_2$ is connected to the united drain line DL.

The source lines $SL_1$, $SL_3$ . . . are made under the floating state. So that, no drain current is observed at any of the ferroelectric memory elements $M_{11}$, $M_{12}$, $M_{13}$. . . , $M_{13}$, $M_{23}$, $M_{33}$ . . . connected to the source lines regardless of turning the ferroelectric memory elements into the "ON" state or the "OFF" state. Also, the transistors $Q_{01}$, $Q_{03}$ . . . of the drain lines $DL_1$, $DL_3$ . . . are under the "OFF" state. So that, no drain current is observed at any of the ferroelectric memory elements $M_{11}$, $M_{12}$, $M_{13}$ . . . $M_{31}$, $M_{32}$, $M_{33}$ . . . connected to the drain lines regardless of turning the ferroelectric memory elements into the "ON" state or the "OFF" state. Consequently, the current flows on the united drain line DL is either a predetermined maximum drain current $I_{0MAX}$ (a point X shown in FIG. 6A) or a current equivalent to 0 (A) (a point Y shown in FIG. 6C) depending on the data stored in the ferroelectric memory element $M_{22}$.

In other words, the voltage $V_1$ is generated at the lower conductive layer 30 if data "High" is stored and the voltage $-V_1$ is generated at the lower conductive layer 30 if data "Low" is stored as shown in FIG. 5 in case of setting the gate voltage $V_G$ equivalent to 0V. That is, function of the ferroelectric memory element is similar to that of an ordinal MOSFET being applied either of the voltage $V_1$ or the voltage $-V_1$ to its gate electrode.

The stored data in the ferroelectric memory element $M_{22}$ can be read out by judging whether or not the drain current being detected has a larger value than that of a reference current $I_S$ (a point Z shown in FIG. 6B). In other words, the stored data can be read out nondestructively.

Next, FIG. 8 shows a table showing voltages applied to each of the lines during the stand-by operation. The ferroelectric memory elements are turned into the stand-by state automatically when no address is selected in this embodiment. Change of the stored data is prevented by applying the ground voltage to all the control gate lines and the source lines in the ferroelectric memory elements $M_{11}$, $M_{12}$ . . . $M_{21}$ $M_{22}$ . . . . In other words, the ferroelectric layer 32 of each of the ferroelectric memory elements maintains either the first polarization state or the second polarization state. Further, transistors $Q_{01}$, $Q_{02}$, $Q_{03}$ . . . of all the drain lines $DL_1$, $DL_2$, $DL_3$ . . . are under the "OFF" state. These states will be maintained even after the power source is turned off.

Although, the voltage being applied to the united drain line DL is set at a voltage similar to the minimum voltage capable of judging the stored data by evaluating the drain current during the read-out operation in this embodiment, the voltage of the united drain line DL may also be increased within a range as long as the increased value does not affect the stored data noticeably.

Also, though either of the power source voltages $+V_{DD}$ or $-V_{DD}$ is applied as the voltage for storing the data into the ferroelectric memory elements in the embodiment described above, a voltage either having a larger value or less value than that of the power source voltages $+V_{DD}$ or $-V_{DD}$ can be applied as the voltage for storing the data. It is much preferable to apply either of the power source voltages $+V_{DD}$ or $-V_{DD}$ as the voltage for storing the data because no extra circuit for generating the voltage for storing the data is required.

Although, the threshold voltage $V_{th}$ is set to a value slightly higher than that of the voltage $-V_1$ in the embodiment described above, the threshold voltage $V_{th}$ may be set at any value between the voltage $-V_1$ and the voltage $+V_1$.

Also, though the stored data is read out by judging formation of a channel within the channel region based on the detected value of the drain current in the embodiment described above, formation of the channel can be judged by using any other method.

Further, the ferroelectric memory element M described above as an embodiment of the present invention is a memory element so called a negative type channel ferroelectric memory element. The present invention can also be applied to a ferroelectric memory element having a positive type channel.

Although, the ferroelectric memory element having the lower conductive layer being made so as to be under the floating state all the time is described as an example of the present invention in the embodiment herein, the present invention is not limited to the structure, the present invention can also be applied to another type of ferroelectric memory element, for instance, the ferroelectric memory element capable of carrying out the write operation by applying a voltage directly between the lower conductive layer having a memory gate electrode thereunder and the upper conductive layer.

The present invention is characterized in that, the critical voltage of the lower conductive layer capable of forming the predetermined channel in the channel region is set within a range between the first lower conductive layer voltage and the second lower conductive layer voltage in the case of defining the voltage detected at the lower conductive layer under the first polarization state as the first lower conductive layer voltage when a voltage applied to the upper conductive layer relative to the source region is substantially 0V and defining the voltage detected at the lower conductive layer under the second polarization state as the second lower conductive layer voltage when the voltage applied to the upper conductive layer relative to the source region is substantially 0V.

So that, the predetermined channel is formed in the channel region when the stored data is the first storing data in the case of applying a voltage 0V to the upper conductive layer and the predetermined channel is not formed in the channel region when the stored data is the second storing data in the case of applying a voltage 0V to the upper conductive layer. Consequently, both of the source region and the upper conductive layer may be grounded during the read out operation. That is, the voltage applied to the ferroelectric layer can be maintained in a certain value even when a circuit for supplying a correct reference voltage is not provided to the ferroelectric memory device additionally. Further, unstable condition of the voltages applied to the ferroelectric layer during the switching of the power source under ON and OFF can be avoided. Therefore, the polarization state of the ferroelectric layer is not changed unexpectedly because the voltage applied to the ferroelectric layer maintains a stable condition.

In other words, it is possible for the present invention to realize a ferroelectric memory device capable of maintaining its nonvolatility semipermanently with maintaining high integration.

The present invention is characterized in that, the critical voltage of the lower conductive layer is set at a value similar to the second lower conductive layer voltage within the range between the first lower conductive layer voltage and the second lower conductive layer voltage.

So that, a large amount of the drain current can be flown when the data stored in the ferroelectric memory device is in the first storing condition, and just a small amount of the drain current is flown when the data stored in the ferroelectric memory device is in the second storing condition. As a result, the read out operation can be done at a high speed.

The present invention is characterized in that, a capacitance between the channel region and the lower conductive layer is set so as to approximately maximize a voltage difference between the first lower conductive layer voltage and the second lower conductive layer voltage.

So that, enough tolerance for detection can be secured during the read-out operation. As a result, reliability of the read out operation can be increased.

The present invention is characterized in that, the lower conductive layer is formed so as to be a floating state all the time, the lower, conductive layer is formed so as to be a floating state all the time, and wherein the ferroelectric layer is polarized to either of the first polarization state or the second polarization state by applying a first storing voltage to the upper conductive layer relative to the source region or by applying a second storing voltage having the same absolute value and opposite polarity to the first storing voltage to the upper conductive layer relative to the source region when the storing data is stored in the ferroelectric memory element.

So that, leakage current can be minimized by making the lower conductive layer under the floating state. As a result, nonvolatility of the stored data can be increased.

Further, a total of two storing voltages having almost the same absolute value and opposite polarity are used for storing the data. Consequently, both the storing voltages can be obtained from the power source voltages having negative polarity and positive polarity. In addition, no circuit for generating the storing voltages is needed when the power source voltages can be used as the storing voltages. In that case, integration of the ferroelectric memory device can be increased.

The present invention is characterized in that, the data stored in the ferroelectric memory device is read out by judging whether the predetermined channel is formed in the channel region or not by setting the voltage applied to the upper conductive layer relative to the source region as substantially 0V.

So that, a stable voltage can be applied to the ferroelectric layer constantly during the read out operation. As a result, the stored data is not changed erroneously.

The present invention is characterized in that, the judgement of formation of the channel is carried out by detecting whether or not a current being detected at the drain region has a higher value than a predetermined value when the voltage applied to the drain region relative to the source region is set as a predetermined drain voltage, and the drain voltage is set at a value substantially equal to a minimum voltage capable of carrying out the judgement.

So that, a voltage detected at the center of the channel region has a similar value as a voltage detected at the source region during the read out operation. Consequently, the voltage detected at the upper conductive layer relative to the center of the channel region is almost equivalent to 0V regardless of flowing the drain current or not. In other words, the stored data is not changed erroneously regardless of carrying out the read out operation or not because the voltage applied to the ferroelectric layer become stable.

The present invention is characterized in that, the voltage applied to the upper conductive layer relative to the source region is set as substantially 0V. So that, a stable voltage can be applied to the ferroelectric layer constantly similarly to the read out operation even when the stand by operation is carried out. As a result, the stored data is not changed erroneously.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A ferroelectric memory device including a ferroelectric memory element, the ferroelectric memory element comprising:

a source region and a drain region both of which are made of a first conductive type material, a channel region being made of a second conductive type material located between the source region and the drain region, a lower conductive layer being formed on the channel region as a conductive layer electrically insulated therefrom, a ferroelectric layer being formed on the lower conductive layer capable of storing either of a first polarization state corresponding to a first storing data or a second polarization state corresponding to a second storing data respectively, and an upper conductive layer being formed on the ferroelectric layer as a conductive layer, wherein the ferroelectric memory device is characterized in that, a predetermined channel is formed in the channel region when a voltage detected at the lower conductive layer is equivalent to a first lower conductive layer voltage and the predetermined channel is not formed in the channel region when the voltage detected at the lower conductive layer is equivalent to a second lower conductive layer voltage by setting a critical voltage of the lower conductive layer capable of forming the predetermined channel in the channel region, the critical voltage of the lower conductive layer is set within a range between the first lower conductive layer voltage and the second lower conductive layer voltage in case of defining the voltage detected at the lower conductive layer under the first polarization state as the first lower conductive layer voltage when a voltage applied to the upper conductive layer relative to the source region is substantially 0V and defining the voltage detected at the lower conductive under the second polarization state as the second lower conductive layer voltage when the voltage applied to the upper conductive layer relative to the source region is substantially 0V.

2. The ferroelectric memory device in accordance with claim 1, wherein the critical voltage of the lower conductive layer is set at a value similar to the second lower conductive layer voltage within the range between the first lower conductive layer voltage and the second lower conductive layer voltage.

3. The ferroelectric memory device in accordance with claim 1, wherein the critical voltage of the lower conductive layer is adjusted by varying density of impurities in the channel region.

4. The ferroelectric memory device in accordance with claim 1, wherein the critical voltage of the lower conductive layer is adjusted by varying work function difference between the upper conductive layer and the lower conductive layer.

5. The ferroelectric memory device in accordance with claim 1, further including a capacitance between the channel region and the lower conductive layer, and wherein the capacitance between the channel region and the lower conductive layer is set so as to approximately maximize a voltage difference between the first lower conductive layer voltage and the second lower conductive layer voltage.

6. The ferroelectric memory device in accordance with claim 5, wherein the capacitance between the channel region and the lower conductive layer is set to a value slightly higher than a capacitance which maximize the voltage difference between the first lower conductive layer voltage and the second lower conductive layer voltage.

7. The ferroelectric memory device in accordance with claim 1, wherein the lower conductive layer is formed so as to be floating state all the time, and wherein the ferroelectric layer is polarized to either of the first polarization state or the second polarization state by applying a first storing voltage to the upper conductive layer relative to the source region or by applying a second storing voltage having same absolute value and opposite polarity to the first storing voltage to the upper conductive layer relative to the source region when the storing data is stored in the ferroelectric memory element.

8. The ferroelectric memory device in accordance with claim 1, wherein the ferroelectric memory device is formed so as to be able to apply a voltage directly between the upper conductive layer and the lower conductive layer.

9. A ferroelectric memory device including a ferroelectric memory element, the ferroelectric memory element comprising:

a source region and a drain region both of which are made of a first conductive type material, a channel region being made of a second conductive type material located between the source region and the drain region;

a lower conductive layer being formed on the channel region as a conductive layer electrically insulated therefrom, a ferroelectric layer being formed on the lower conductive layer capable of storing either of a first polarization state corresponding to a first storing data or a second polarization state corresponding to a second storing data respectively, and an upper conductive layer being formed on the ferroelectric layer as a conductive layer;

wherein the ferroelectric memory device is characterized in that, a predetermined channel is formed in the channel region when a voltage detected at the lower conductive layer is equivalent to a first lower conductive layer voltage and the predetermined channel is not formed in the channel region when the voltage detected at the lower conductive layer is equivalent to a second lower conductive layer voltage by setting a critical voltage of the lower conductive layer capable of forming the predetermined channel in the channel region, the critical voltage of the lower conductive layer is set within a range between the first lower conductive layer voltage and the second lower conductive layer voltage in case of defining the voltage detected at the lower conductive layer under the first polarization state as the first lower conductive layer voltage when a voltage applied to the upper conductive layer relative to the source region is substantially 0V and defining the voltage detected at the lower conductive under the second polarization state as the second lower conductive layer voltage when the voltage applied to the upper conductive layer relative to the source region is substantially 0V, and wherein the critical voltage of the lower conductive layer is adjusted by varying electric charges being held within an insulation layer formed between the channel region and the lower conductive layer.

10. A method for reading out data stored in a ferroelectric memory device, the memory device having a ferroelectric memory element that includes a source region and a drain region, a channel region located between the source region and the drain region, a lower conductive layer formed on the channel region and electrically insulated therefrom, a ferroelectric layer formed on the lower conductive layer and capable of storing either of a first polarization state corresponding to a first storing data or a second polarization state corresponding to a second storing data respectively, and an upper conductive layer formed on the ferroelectric layer, wherein the method comprises: judging whether a predetermined channel is formed in the channel region or not by setting a voltage applied to the upper conductive layer relative to the source region as substantially 0V.

11. The method for reading out data in accordance with claim 10, wherein the judgement is carried out by detecting whether or not a current being detected at the drain region has a higher value than a predetermined value when a voltage applied to the drain region relative to the source region is set as a predetermined drain voltage, and wherein the drain voltage is set at a value substantially equal to a minimum voltage capable of carrying out the judgement.

12. A method for carrying out stand-by operation of a ferroelectric memory device, the memory device having a ferroelectric memory element that includes a source region and a drain region, a channel region located between the source region and the drain region, a lower conductive layer formed on the channel region and electrically insulated therefrom, a ferroelectric layer formed on the lower conductive layer and capable of storing either of a first polarization state corresponding to a first storing data or a second polarization state corresponding to a second storing data respectively, and an upper conductive layer formed on the ferroelectric layer, wherein the method comprises: setting a voltage applied to the upper conductive layer relative to the source region at a value substantially equal to 0V.

* * * * *